United States Patent [19]

Fisher et al.

[11] Patent Number: 5,419,829
[45] Date of Patent: May 30, 1995

[54] ELECTROPLATING PROCESS

[75] Inventors: Gordon Fisher, Sudbury; John J. Bladon, Wayland; Wade Sonnenberg, Foxboro; Robert L. Goldberg, Sharon, all of Mass.

[73] Assignee: Rohm and Haas Company, Philadelphia, Pa.

[21] Appl. No.: 243,980

[22] Filed: May 17, 1994

[51] Int. Cl.$^6$ ............................................. C25D 5/154
[52] U.S. Cl. ..................................... 205/166; 205/184
[58] Field of Search ................................. 205/166, 184

[56] References Cited

U.S. PATENT DOCUMENTS

| | | | |
|---|---|---|---|
| 3,011,920 | 12/1961 | Shipley, Jr. | 117/213 |
| 3,099,608 | 7/1963 | Radovsky et al. | 204/15 |
| 3,657,003 | 4/1972 | Kenney | 117/120 |
| 4,895,739 | 1/1990 | Bladon | 204/15 |
| 4,919,768 | 4/1990 | Bladon | 204/15 |
| 4,952,286 | 8/1990 | Bladon et al. | 204/15 |

*Primary Examiner*—John Niebling
*Assistant Examiner*—Kishor Mayekar
*Attorney, Agent, or Firm*—Robert L. Goldberg

[57] ABSTRACT

A method for electroplating a nonconducting surface using a metal oxide colloid. The process comprises contacting the surface of the nonconductor to be plated with a preformed colloid of a metal oxide to adsorb the colloid onto the surface of the nonconductor and then electroplating metal over the surface having the adsorbed metal oxide colloid. The process may include a step of reducing the metal oxide to a lower valent state prior to the step of metal plating.

22 Claims, No Drawings

ELECTROPLATING PROCESS

BACKGROUND OF THE INVENTION

I. Introduction

This invention relates to electroplating nonconductors, and more particularly, to a process and composition for electroplating the surface of a nonconductor using a preformed colloid of a metal oxide that, when absorbed onto a nonconducting surface, functions as a base for direct electroplating. The invention is especially useful for the manufacture of printed circuit boards.

II. Description of the Prior Art

Nonconducting surfaces are conventionally metallized by a sequence of steps comprising catalysis of the surface of the nonconductor to render the same catalytic to electroless metal deposition followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrodeposition of a metal over the electroless metal coating to a desired thickness. Electrolytic deposition is possible because the electroless metal deposit serves as a conductive coating that permits electroplating.

Catalyst compositions useful for electroless metal plating are known in the art and disclosed in numerous publications including U.S. Pat. No. 3,011,920, incorporated herein by reference. The catalyst of this patent consists of an aqueous suspension of a tin-noble or precious (catalytic) metal colloid. Surfaces treated with such catalysts promote the generation of electrolessly formed metal deposits by the oxidation of a reducing agent in an electroless plating solution catalyzed by the catalytic colloid.

Electroless plating solutions are aqueous solutions containing both a dissolved metal and a reducing agent in solution. The presence of the dissolved metal and reducing agent together in solution results in plate-out of metal in contact with a catalytic metal tin catalyst. However, the presence of the dissolved metal and reducing agent together in solution can also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by use of stabilizers in solution which inhibit indiscriminate deposition, but which also retard plating rate.

Attempts have been made in the past to avoid the use of an electroless plating solution by a direct plating process whereby a metal may be deposited directly over a treated nonconductive surface. One such process is disclosed in U.S. Pat. No. 3,099,608, incorporated herein by reference. The process disclosed in this patent involves treatment of the nonconductive surface with a tin-palladium colloid which forms an essentially nonconductive film of colloidal palladium particles over the nonconductive surface. This is the same tin-palladium colloid used as a plating catalyst for electroless metal deposition. For reasons not fully understood, it is possible to electroplate directly over the catalyzed surface of the nonconductor from an electroplating solution though deposition occurs by propagation and growth from a conductive surface. Therefore, deposition begins at the interface of a conductive surface and the catalyzed nonconductive surface. The deposit grows epitaxially along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from the interface.

An improvement in the process of U.S. Pat. No. 3,099,608 is described in U.K. Patent No. 2 123 036 B, incorporated herein by reference. In accordance with the process described in this patent, a surface is provided with metallic sites and the surface is then electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608, i.e., by immersion of the nonconductive surface in a solution of a tin-palladium colloid. The additive in the electroplating solution responsible for inhibiting deposition is described as one selected from a group of dyes, surfactants, chelating agents, brighteners, and leveling agents. Many of such materials are conventional additives for electroplating solutions.

Further improvements in the processes for the direct electroplating of nonconductors are disclosed in U.S. Pat. Nos. 4,895,768 and 4,952,286, each incorporated herein by reference. In accordance with the processes of these patents, an electroless plating catalyst, such as that disclosed in the aforesaid. U.K. patent, is treated with an aqueous solution of a chalcogen, such as a sulfur solution, to convert the catalytic surface to a chalcogenide surface. By conversion of the surface to the chalcogen conversion coating, the electroless plating catalyst does not desorb from the surface during metallization, and consequently, in accordance with the processes of said patents, it is possible to pattern plate substrates in the formation of printed circuit boards.

The processes of the aforementioned patents provide a substantial improvement over the process of the U.K. patent. However, it has also been found that treatment of an absorbed catalytic metal or over a nonconductor with a solution of a chalcogenide, especially a sulfide solution, results in a formation of a chalcogenide on all metal surfaces in contact with the solution of the chalcogen. Therefore, if the process is used in the manufacture of primed circuit boards, the copper cladding or conductors of the primed circuit board base material are converted to the chalcogenide together with the catalytic metal. If the chalcogenide of the copper is not removed prior to plating, it can reduce the bond strength between the copper and a subsequently deposited metal over the copper.

SUMMARY OF THE INVENTION

The subject invention provides a further improvement in processes for electroplating nonconductors. In accordance with the invention described herein, a stable colloidal solution of a preformed metal oxide is prepared and a nonconductor is then contacted with the colloidal composition such as by immersion whereby the colloidal oxide absorbs on the surface of the nonconductor. Following absorption of the colloidal oxide on the surface of the nonconductor, and desirably a step of reduction, the nonconductor may be electroplated following procedures disclosed in the aforesaid U.S. Pat. Nos. 4,895,739; 4,919,768; and 4,952,286.

The process of the invention is an improvement over the earlier processes for plating nonconductors, especially those having metallic surface regions, as metal surfaces do not come in contact with a solution of a chalcogen thus forming a chalcogenide which is desirably removed prior to plating. The number of steps required to practice the process of the subject application is reduced due to the avoidance of the step of separately removing a chalcogenide from exposed metal surfaces prior to plating.

DESCRIPTION OF THE PREFERRED EMBODIMENTS

The subject invention is suitable for manufacture of a variety of commercial articles where a metal deposit is desired over the surface of a nonconductor. However, the invention is especially useful for the fabrication of printed circuit boards. For this reason, the description that follows is directed primarily to printed circuit board manufacture.

As aforesaid, the invention described herein involves the use of a preformed colloid of a metal oxide that is absorbed onto the surface of a part to be plated. The preformed colloid of the metal oxide is desirably prepared in a manner that enhances absorption of the colloid onto the surface of the nonconductor to be plated. Factors that influence absorption of a colloid onto a substrate are particle size and net charge, the charge being more important than the particle size. To enhance absorption of the colloid onto a substrate, the colloid should be finely divided and desirably carry a net charge opposite from that of the substrate following conditioning. Metal oxide colloids may be formed from many metals. Examples of the formation of metal oxides are disclosed in U.S. Pat. No. 3,657,003, granted Apr. 18, 1972, and in *Inorganic Colloid Chemistry* by H. B. Weiser, Vol. 2, "The Hydrous Oxides and Hydroxides," Ch. 1, John Wiley & Sons, New York (1935), both incorporated herein by reference.

Metal oxides are formed by preparing an aqueous solution of a salt of a desired metal with agitation, pH adjustment, and heat as necessary to obtain complete dissolution of the salt in solution. Thereafter, a hydrolysis and nucleation reaction is permitted or caused to take place at a controlled rate within the solution. This reaction takes place until an oxide, often a hydrous oxide, is formed in situ. The hydrolysis reaction is permitted to continue until the solubility limit of the solution is exceeded to form a separate, dispersed colloidal phase. In a preferred embodiment of the invention, the oxide is formed in the presence of an oxidizing agent. The oxidizing agent provides two advantages. First, it promotes oxide formation during hydrolysis. Secondly, residual oxidization agent remaining in solution oxidizes metallic regions thus reducing oxide adsorption on the metallic regions. This is desirable as retained oxide on metallic regions of a printed circuit hole-wall at the interface with an innerlayer following plating can lead to interconnect defects. Details of the hydrolysis reaction can be found in the above-cited references and do not constitute a part of this invention, though the use of the metal oxide for direct electroplating is considered invention.

Examples of suitable metal oxides for purposes of the invention include noble metal oxides such as oxides of gold, platinum, palladium and ruthenium and oxides of non-noble metals such as cobalt, copper, nickel, silver, iron, manganese, titanium, zirconium, etc. Preferred noble metal oxides comprise oxides of platinum and palladium. Preferred colloids of non-noble metals comprise copper, cobalt, nickel and silver. The colloids of the noble metal are preferred as they are less readily attacked by processing chemicals used in the manufacture of printed circuits. For example, in circuit manufacture, a conventional step is etching metallic regions prior to plating. The etchant used is typically an acid etchant. An acid etchant would dissolve non-noble metal oxides. If a non-noble metal oxide is used, then the etchant should be an alkaline etchant.

The colloids are formed in aqueous suspension. The metal content of the colloid may vary within broad limits, typically from about 0.001 to 25 grams per liter. The colloidal oxides of the non-noble metals would typically be used in greater concentration than colloidal oxides of the noble metals. The non-noble metal colloids are more preferably used within a range of from about 2.5 to 20 grams per liter of solution while the noble metal colloids would typically have a metal content ranging between about 0.1 and 1.0 grams per liter. The oxidizing agent used in the preferred embodiment of the invention may be any conventional oxidant such as hydrogen peroxide or an alkali or alkaline earth metal chlorate, borate or "per" compound such as a perchlorate. The oxidizing agent may be added in amounts equivalent to those set forth for the metal content of the colloid.

A convenient method for formation of the colloids of the invention comprise dissolution of a metal salt of the metal in aqueous solution adjusted to a pH to dissolve the metal and then altering the pH until a hydrous oxide forms in the presence or absence of the oxidant. Examples illustrating the formation of oxides suitable for use in the subject invention follow.

EXAMPLE 1

Formation of a hydrous oxide of palladium—A 1 percent by weight solution of palladium chloride may be dissolved in 100 ml of water. The mixture may then be stirred until the maximum amount of palladium chloride is dissolved. The pH of the solution at this point would be about 2.7 but would decrease slowly with formation of a murky brown hydrous oxide colloid of palladium.

EXAMPLE 2

The process of Example 1 would be repeated with 1 gram of sodium persulfate added to the solution.

EXAMPLE 3

Formation of hydrous oxide of palladium—An alternative method 10 ml of a 5 percent by weight stock solution of palladium chloride may be added to 100 ml of water. The initial pH of the solution would then be raised with dilute sodium hydroxide to pH of about 3.0 to form a brown hydrous oxide colloid.

EXAMPLE 4

Formation of a hydrous oxide of platinum—A 1 percent by weight solution of platinous dichloride may be formed by dissolving the salt in 100 ml of hot (70° C.) dilute hydrochloric acid. After cooling to room temperature, the pH of the solution may then be raised to 3 with sodium hydroxide to form a yellow hydrous oxide colloid of platinum.

EXAMPLE 5

Formation of a hydrous oxide of copper—A 1 percent by weight solution of cupric chloride may be formed by dissolving the cupric chloride in 100 ml of water. The solution may then be heated to about 70° C. while the pH would be continuously adjusted as necessary to about 6 with sodium hydroxide. After about 60 minutes of heating, a deep blue hydrous oxide of copper would be formed.

EXAMPLE 6

Formation of a hydrous oxide of silver—A 0.25 percent by weight solution of silver nitrate may be formed by dissolving the salt in 100 ml of water with the pH raised rapidly to about 7 with sodium hydroxide. The pH would then be slowly raised with sodium hydroxide to a range of from 8 to 9 to form a milky white hydrous oxide of silver.

EXAMPLE 7

Formation of a hydrous oxide of gold—A 1 percent by weight solution of auric chloride would be dissolved in 100 ml of water to produce a yellow solution. The pH would then be slowly raised over a period of 2 days to about 4 to 5 with sodium hydroxide. During the raising of the pH, the solution would be continuously stirred and slightly heated to about 40° C. to form brown hydrous oxide of gold colloid.

EXAMPLE 8

Formation of a hydrous oxide of nickel—A 1 percent by weight solution of nickel chloride hexahydrate would be dissolved in 100 ml of water and sodium hydroxide added in sufficient quantity to effect a Tyndal cone. The solution would be heated to about 60° C. for 2 days keeping the pH adjusted to about 4.0 to form a green hydrous oxide.

EXAMPLE 9

Formation of a hydrous oxide of iron—A 1 percent by weight solution of ferric chloride hexahydrate would be dissolved in 100 ml of water while heating the solution to about 70° C. with stirring. The pH would be adjusted to about 1.8 to form a tan hydrous oxide.

EXAMPLE 10

Formation of a hydrous oxide of manganese—A 1 percent by weight solution of manganese trichloride would be dissolved in 100 ml of hydrochloric acid solution to form a solution having a pH of about 1.0. Hydrogen peroxide would then be added. The solution would be heated and the pH maintained with sodium hydroxide to form a brown hydrous oxide.

EXAMPLE 11

Formation of a hydrous oxide of cobalt—A 1 percent by weight solution of cobaltous chloride hexahydrate would be dissolved in 100 ml of water to form a solution having a pH of about 5.0. The pH would then be increased with sodium hydroxide to about 7.0 to form a blue hydrous oxide.

In accordance with the invention described herein, the preformed colloid of the oxide is integrated into a standard electrolytic plating line with changes to the processing sequence occurring as indicated in the following description.

In printed circuit board manufacture, the substrate commonly used is an epoxy substrate filled with glass fibers and copper clad on at least one of its surfaces. As is known in the art, the epoxy can be substituted or mixed with other resins for specific purposes.

In the manufacture of a double-sided printed circuit board, a first step comprises the formation of through-holes by drilling or punching or any other method known to the art. Following formation of the holes, it is desirable to employ the conventional steps of rinsing with an organic solution to clean and degrease the board. This is followed by desmearing the hole walls with sulfuric acid, chromic acid, permanganate, or plasma etching. Following desmearing, the circuit board base material is conventionally treated with a glass etch that removes glass fibers extending into the holes from the hole walls. This is followed by a solution that neutralizes acid residues and then the hole walls are conditioned to promote catalyst adsorption. Such solutions are often referred to as conditioners and typically comprise an aqueous alkaline surfactant solution for cleaning soil and a quaternary amine to condition the hole wall. This treatment step, by itself, is old in the art and does not constitute a part of the invention.

Following formation and treatment of the holes, the next steps in the processing sequence involves adsorption of the metal oxides onto the non-conducting surfaces. This is readily accomplished by immersion of the substrate into the colloidal suspension of the oxide formed by the process of any of Examples 1 to 10 above. The time of immersion should be sufficient to form a sufficiently heavy layer of the colloidal material onto the non-conducting surfaces. Typically, immersion times of from about 1 minute to 1 hour are suitable dependent upon the actual colloid used. Preferably, the substrate is immersed into the colloidal dispersion for a period of time ranging between 5 and 20 minutes. Temperature is not critical and may vary from about room temperature to a temperature just below that temperature where the colloid begins to aggregate and precipitate from its suspension.

Following deposition of the colloidal oxide onto the substrate, the board may be dried to enhance the adhesion of the colloidal oxide to the substrate. Drying conditions are not critical and typically drying is at a temperature of at least 200° F. for a time of from 5 minutes to several hours is satisfactory. Thereafter, following the optional drying step, the board may be immersed in a solution of a reducing agent to at least partially reduce the oxide to metal. It is believed that the step of reduction is more advantageous with non-noble metal oxides than with noble metal oxides. For example, a reducing agent is highly desirable when the colloidal oxide is copper oxide while the solution of the reducing agent displays only limited benefit with colloids of palladium. The reducing agent used in the process is one capable of reducing the oxide to a lower valent state, it being recognized that some metals are more readily reduced than others. Therefore, for easily reducible metal oxides, solutions of hypophosphite and formaldehyde are suitable while for other metals, borohydride or an amine borane solution may be required.

The reducing agent is used by immersion of the substrate having the metal oxide coating over its surface into an aqueous solution of the reducing agent. The solution of the reducing agent may contain the agent in an amount of from about 1 to 100 grams per liter or more. Preferably, the reducing agent is present in an amount of from 5 to 50 grams per liter of solution. The solution of the reducing agent may be used at a temperature of from room temperature up to about 200° F. with temperatures of from about 100° to 150° F. being preferred. The time of immersion of the part into the solution of the reducing agent may vary from about 1 to 15 minutes and more preferably varies from about 2 to 10 minutes.

Following formation of the colloid on the board, and a step of reduction if used, the board is prepared for electrolytic deposition. This process involves etching of the metallic surface regions with an etchant. This is a conventional step used to remove surface contaminants from the metallic surfaces such as dirt and grease. Conventional acid etchants are suitable for this process using noble metal colloidal oxides such as, for example, a sulfuric acid-hydrogen peroxide pre-etch such as PREPOSIT®746 Etchant available from Shipley Company of Marlborough, Mass. If a non-noble metal oxide is used, the etchant is desirably an alkaline etchant such as an ammoniacal etchant. The etchant may be used at room temperature for a period of time ranging between 1 and 3 minutes. The use of this etchant effectively removes soil and contaminants as well as the protective film from the metallic surface regions of the substrate.

The next step in the process comprises electroplating directly over a substrate avoiding an intermediate step of electroless metal plating. The electroplating procedure is similar to the procedure disclosed in the above-referenced U.K. Patent, but careful control of the electroplating parameters as required in the process of the U.K. Patent is not necessary in the process of this invention. The electroplating process may use electroplating solutions such as those disclosed in the U.K. Patent. The preferred electroplating metals in accordance with the invention are copper and nickel though the process is suitable for electroplating of any desired metal. A typical electroplating solution comprises an aqueous acid solution of the metal desired to be plated together with proprietary additives from the groups of dyes, surfactants, chelating agents, brighteners, leveling agents, etc. Typical acids used in the formulation of said baths comprise those with a high ionic dissociation constant for maximum conductivity such as sulfuric acid, fluoroboric acid, sulfamic acid, etc. Dyes typically used in such baths include methylene blue, methyl violet, and other N-heterocyclic compounds; triphenyl methane-type dyes and aromatic amines, imines and diazo compounds. Suitable surfactants included in such baths typically include non-ionic surfactants such as alkylphenoxy polyethoxyethanols, e.g., octylphenoxy, polyethoxyethanol, etc. Surfactants including wetting agents and water soluble organic compounds such as compounds containing multiple oxyethylene groups have been found to be effective. A preferred group of said compounds include polyoxyethylene polymers having from as many as 20 to 150 repeating units. Also included in this class of materials are block copolymers of polyoxyethylene and polyoxypropylene. The additives described above are added to the solution in conventional concentrations.

The electroplating procedure is conventional. The part to be plated is used as a cathode in a conventional electroplating cell. Current density is conventional and varies typically within a range of from 10 to 40 amps/ft.$^2$. Theoretically, a low initial current density should be preferred with current density increased as an initial deposit is formed. This would be expected to prevent burn-off of the thin conversion coating. However, in practice, adverse results caused by a high initial current density have not been observed. A preferred current density range is from 15 to 30 amps/ft.$^2$. The plating solution is maintained at a temperature ranging between room temperature and about 100° F. Plating is continued for a time sufficient to form a deposit of desired thickness. For circuit board manufacture, a desired thickness may range between 0.5 and 2.0 mils, typically from 1 to 1.5 mils. A plating time of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

EXAMPLE 12

The following example illustrates an electroplating process in accordance with the best mode of the invention. All proprietary chemicals are available from Shipley Company of Marlborough, Mass. An FR4 multilayer circuit board having four circuit layers with an array of 14 and 36 mil holes was subjected to the following procedure.

Step 1 Pre-clean and condition:
  a. immerse in a proprietary organic solvent identified as MLB 211 at 160° F. for 5 minutes and water rinse;
  b. desmear the hole walls with a proprietary permanganate solution identified as MLB 213 Promoter at a temperature of 165° F. for 5 minutes and water rinse;
  c. neutralize acid residues by treatment with a proprietary alkaline solution identified as Neutralizer 218-1 at room temperature for 2 minutes and water rinse;
  d. condition the hole-walls using a proprietary quaternary amine solution identified as XP9420 at a temperature of 105° F. for 5 minutes and water rinse.

Step 2 Form Electroplating Sites:
immerse the substrate in the colloidal solution formed in Example 1 at a temperature of 120° F. for 10 minutes and water rinse;

Step 3 Microetch copper surfaces:
Immerse the board in a proprietary peroxide sulfuric acid microetch identified as XP9425 at 100° F. for 1 minute and water rinse.

Step 4 Electroplate
Electroplate copper from an acid copper electroplating bath identified as ELECTROPOSIT®1100 acid copper at a current density of 20 amps./ft.$^2$ and at a temperature of 70° F. for 1 hour and water rinse to obtain a deposit having a thickness of about 1.5 mils.

EXAMPLE 13

The procedure of Example 11 may be repeated but in this instance, the colloid of Example 2 would be used in place of the colloid of Example 1. Following immersion of the substrate into the colloid solution, the board would be water rinsed and then immersed in a 10% by weight aqueous solution of sodium hypophosphite for 5 minutes at 120° F. Thereafter, the board would be electroplated with copper using the same procedure as set forth in Example 11 with similar results.

We claim:

1. A method of electroplating a nonconductor comprising the steps of contacting a surface of the nonconductor to be plated with a preformed colloid of a metal oxide for a time sufficient to adsorb the same onto the surface thereof and metal plating the contacted surface of the nonconductor by passing a current between electrodes immersed in an electrolyte containing dissolved plating metal where one of said electrodes comprises said non conductor to be plated.

2. The process of claim 1 which, following the step of contact of the surface of the nonconductor with the performed colloid of a metal oxide, and prior to the step of plating, additionally includes contacting the nonconductor with a solution of a reducing agent to at least partially reduce the metal oxide.

3. The process of claim 1 where the nonconductor to be plated is part of an article having a surface containing metallic portions and non-metallic portions.

4. The process of claim 3 where the article to be plated is a printed circuit board substrate.

5. The process of claim 3 where the article is a copper clad printed circuit board substrate having through holes extending from one surface to the other.

6. The process of claim 2 where the colloid of the metal oxide is a colloid of a non-noble metal.

7. The process of claim 6 where the colloid of the metal oxide is a colloid of a metal selected from the group consisting of nickel, copper, cobalt and silver.

8. The process of claim 6 where the colloid of the metal oxide is a colloid of copper.

9. The process of claim 6 where the colloid of the metal oxide is a colloid of nickel.

10. The process of claim 6 where the metal content of the metal oxide colloid varies between 2.5 and 20 grams per liter of solution.

11. The process of claim 1 where the colloid of the metal oxide is a colloid of a noble metal.

12. The process of claim 11 where the colloid of the metal oxide is a colloid of a metal selected from the group consisting of platinum and palladium.

13. The process of claim 12 where the colloid of the metal oxide is a colloid of palladium.

14. The process of claim 12 where the colloid of the metal oxide is a colloid of platinum.

15. The process of claim 12 where the metal content of the metal oxide colloid varies between 0.1 and 1.0 grams per liter of solution and the solution of the colloid contains an oxidizing agent.

16. A method for making a printed circuit board, said method comprising the steps of providing a copper clad printed circuit board base material having an array of holes drilled therethrough, contacting a surface of said through holes with a preformed colloid of a metal oxide for a time sufficient to adsorb the same onto the surface thereof and metal plating the contacted surface by passing a current between electrodes immersed in an electrolyte containing dissolved plating metal where one of said electrodes comprises said circuit board base material having said through holes to be plated.

17. The process of claim 16 which, following the step of contact of the surface of the through holes with the preformed colloid of a metal oxide, and prior to the step of plating, additionally includes contacting the through holes with a solution of a reducing agent to at least partially reduce the metal oxide.

18. The process of claim 16 where the colloid of the metal oxide is a colloid of a non-noble metal selected from the group consisting of nickel, copper, cobalt and silver.

19. The process of claim 18 where the colloid of the metal oxide is a colloid of copper.

20. The process of claim 16 where the colloid of the metal oxide is a colloid of a noble metal selected from the group consisting of platinum and palladium.

21. The process of claim 20 where the colloid of the metal oxide is a colloid of palladium.

22. The process of claim 20 where the metal content of the metal oxide colloid varies between 0.1 and 1.0 grams per liter of solution and the solution of the metal oxide colloid contains an oxidizing agent.

* * * * *